US007479732B2

(12) United States Patent
Rossner

(10) Patent No.: US 7,479,732 B2
(45) Date of Patent: Jan. 20, 2009

(54) LUMINESCENCE CONVERSION OF LED WITH PHOSPHORESCENCE EFFECT, AND USE THEREOF AND OPERATIONAL METHOD ASSOCIATED THEREWITH

(75) Inventor: Wolfgang Rossner, Holzkirchen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 426 days.

(21) Appl. No.: 10/546,051

(22) PCT Filed: Mar. 12, 2004

(86) PCT No.: PCT/DE2004/000505

§ 371 (c)(1),
(2), (4) Date: Aug. 17, 2005

(87) PCT Pub. No.: WO2004/082032

PCT Pub. Date: Sep. 23, 2004

(65) Prior Publication Data

US 2006/0164004 A1 Jul. 27, 2006

(30) Foreign Application Priority Data

Mar. 13, 2003 (DE) ............................... 103 11 056

(51) Int. Cl.
*H01L 33/00* (2006.01)
(52) U.S. Cl. ...................................... 313/503; 313/512
(58) Field of Classification Search .................. None
See application file for complete search history.

(56) References Cited

U.S. PATENT DOCUMENTS

| 5,644,190 | A | * | 7/1997 | Potter | 313/336 |
| 6,039,894 | A | | 3/2000 | Sanjurjo et al. | |
| 6,319,425 | B1 | | 11/2001 | Tasaki et al. | |
| 6,504,179 | B1 | | 1/2003 | Ellens et al. | |
| 6,621,211 | B1 | * | 9/2003 | Srivastava et al. | 313/503 |
| 6,943,433 | B2 | * | 9/2005 | Kamada | 257/666 |

FOREIGN PATENT DOCUMENTS

| CN | 1381072 | 11/2002 |
| DE | 196 38 667 A1 | 4/1998 |
| DE | 199 30 174 A1 | 1/2001 |
| EP | 0 279 032 A | 8/1988 |
| EP | 0 877 071 A1 | 3/1998 |
| JP | 2-8291 | 1/1990 |
| JP | 8-87965 | 4/1996 |
| JP | 09 146482 A | 6/1997 |

OTHER PUBLICATIONS

Sella C. et al., "R.F.-Sputtered Luminescent Rare Earth and Yttrium Oxysulphide Films", Elsevier-Sequoia, S.A., Thin Solid Films, vol. 90, No. 2, pp. 181-185, Apr. 16, 1982.

* cited by examiner

*Primary Examiner*—Ashok Patel
(74) *Attorney, Agent, or Firm*—Cohen Pontani Lieberman & Pavane LLP

(57) ABSTRACT

A light source, comprising at least one LED for emitting primary radiation, and at least one phosphor for converting the primary radiation into secondary radiation. The secondary radiation has a decay time at room temperature of at least 0.1 seconds before the luminescence intensity of the secondary radiation is no longer perceptible to the human eye.

16 Claims, 2 Drawing Sheets

LUMINESCENCE CONVERSION OF LED WITH PHOSPHORESCENCE EFFECT, AND USE THEREOF AND OPERATIONAL METHOD ASSOCIATED THEREWITH

RELATED APPLICATIONS

This is a U.S. national stage of International Application No. PCT/DE2004/000505, filed on 12 Mar 2004.

This patent application claims the priority of German patent application no. 103 11 056.9 filed Mar. 13, 2003, the disclosure content of which is hereby incorporated by reference.

FIELD OF THE INVENTION

The invention relates to a light source, including at least one LED for emitting primary radiation and at least one phosphor for converting the primary radiation into secondary radiation. The invention also describes the use of the light source and a suitable operating method.

BACKGROUND OF THE INVENTION

A light source of the above type is known, for example, from DE 196 38 667 C2. The light source is described as a luminescence conversion LED. The LED (light-emitting diode) of the light source has, as active layer, for example, a semiconductor layer of gallium indium nitride (GaInN). This layer is electrically driven to emit primary radiation from a first wavelength region. The LED emits "blue" light. An intensity maximum of the primary radiation is at approximately 450 nm. The primary radiation is converted into secondary radiation with the aid of the phosphor. The phosphor is, for example, yttrium aluminum garnet activated or doped with cerium (YAG:Ce, $Y_3Al_5O_{12}$:Ce).

The phosphor absorbs the primary radiation and emits secondary radiation from a second wavelength region. The phosphor emits "yellow" luminescent light with an intensity maximum that is dependent on the cerium concentration.

The phosphor is embedded, in the form of powder particles, in an epoxy resin or a low-melting inorganic glass. The epoxy resin or glass serves as a matrix for the powder particles. When the LED has been switched on, the phosphor of the powder particles is excited to emit the secondary radiation (luminescence). As soon as the LED has been switched off, no primary radiation is emitted, and consequently also no secondary radiation is emitted. The light source is extinguished. The light source is extinguished at almost exactly the same time as the LED is switched off.

For safety reasons, it may be desirable for the light source to continue to emit light for a longer period of time even in the event of a power failure.

Furthermore, it is known from DE-A 199 30 174 to operate LEDs by means of dimming with a defined duty factor. This technique is known as pulse width modulation (PWM). In general, however, only duty cycles of at best down to 1:100 are possible.

SUMMARY OF THE INVENTION

Therefore, it is an object of the present invention to provide a luminescence conversion LED which emits light for a prolonged period of time even in the event of a power failure. Further objects of the invention are to provide an energy-saving LED and an LED which is as long-lasting as possible.

To achieve this object, one aspect of the invention provides a light source, including at least one LED for emitting primary radiation and at least one phosphor for converting the primary radiation into secondary radiation. The light source is characterized in that the secondary radiation has a decay time at room temperature of at least 0.1 s before the luminescence intensity of the secondary radiation is no longer perceptible to the human eye.

In this context, room temperature means a temperature from the range from approximately 10° C. to approximately 30° C., but in particular a temperature of approximately 20° C. The secondary radiation preferably has a decay time at room temperature of at least one second.

The light source according to an embodiment of the invention continues to emit light even after a failure or interruption, in cyclical operation, of the supply of current to the LED. This is achieved by virtue of the fact that the secondary radiation of the phosphor has a relatively long decay time. The phosphor of the light source is distinguished by a "phosphorescence effect". After the LED has been switched off and therefore the excitation of the phosphor has ended, the phosphor continues to emit the secondary radiation for a relatively long period of time. The light source continues to be visible after the LED has been switched off. This applies to any desired apparatus for detection of the secondary radiation. In particular, however, this applies to the human eye. Visibility of the light source over the longer period of time is additionally boosted by the sense of sight adapting.

The decay time is preferably several minutes to several hours. Such long decay times of the secondary radiation in particular allow the light source to be used as emergency lighting. The emergency lighting is used, for example, to illuminate any desired space whereof the "normal" light source for illumination has failed. The space is, for example, part of an escape route. The light source allows the escape route to be displayed even in the event of a power failure.

According to a particular configuration, there are a plurality of phosphors with different decay times. As has been indicated above, a single phosphor may have a plurality of emitting states. The secondary radiation originating from these states may differ in terms of the wavelength region of the respective luminescence. If the various secondary radiations also have different decay times, the color of the light emitted by the light source also varies over the course of time after the LED has been switched off.

Therefore, it may be advantageous to provide a plurality of phosphors which are distinguished by virtue of having different decay properties of the secondary radiation but emit in the same wavelength region. As a result, the color of the light emitted by the light source scarcely changes even when the supply of power to the LED is interrupted. The color of the light from the light source remains approximately constant.

The phosphor(s) may be excited to emit the secondary radiation by a single LED. It is also conceivable for each phosphor to be excited to emit the corresponding secondary radiation separately by a dedicated LED with a characteristic primary radiation.

The light source may have a single LED with associated phosphor. In particular, it is also conceivable for a plurality of LEDs with associated phosphor to be arranged in the form of an array. In this case, it is in each case possible to use an identical LED-phosphor combination. It is also conceivable for the array to be constructed from different LED-phosphor combinations.

Any desired phosphor with a suitably long decay time of the luminescence intensity of the secondary radiation can conceivably be used as phosphor. The phosphor may be an organic or inorganic phosphor. In one particular configuration, the phosphor is selected from the group consisting of oxide, aluminate and/or sulfide phosphors. These inorganic phosphors are in each case activated with the aid of one doping or a plurality of dopings. In each case a different photo-physical behavior of the phosphor results as a function of the doping (type and concentration). The doping or dopings influence, for example, both the wavelength region and the decay time of the emission of the secondary radiation.

In one particular configuration, the aluminate phosphor includes an alkaline earth metal aluminate with at least one doping selected from the group consisting of europium ($Eu^{2+}$, $Eu^{3+}$) and/or dysprosium ($Dr^{3+}$). The alkaline earth metal aluminate has a formal composition selected, for example, from the group consisting of $SrAl_2O_4:Eu^{2+},Dy^{3+}$, $CaAl_2O_4$: $Eu^{2+},Dy^{3+}$, $SrAl_{14}O_{25}:Eu^{2+},Dy^{3+}$. A phosphor having the formal composition $SrAl_2O_4:Eu^{2+},Dy^{3+}$ (doping europium and dysprosium), for example after excitation by a wide-band primary radiation at 450 nm, emits green secondary radiation. This phosphor is still providing 10% residual light after 200 min. The other phosphors listed emit blue secondary radiation ($CaAl_2O_4:Eu^{2+}, Dy^{3+}$) and blue-green secondary radiation ($SrAl_{14}O_{25}:Eu^{2+},Dy^{3+}$).

In one particular configuration, the sulfide phosphor includes a zinc sulfide (ZnS) with at least one doping selected from the group consisting of copper ($Cu^+$) and/or silver ($Au^+$). An example of a formal composition of this phosphor is $ZnS:Ag^+, Cu^+$. The phosphor emits green secondary radiation.

In a further configuration, the oxide phosphor includes an yttrium oxysulfide with at least one doping selected from the group consisting of europium ($Eu^{2+}$, $Eu^{3+}$), magnesium ($Mg^{2+}$) and/or titanium ($Ti^{4+}$). A formal composition of this phosphor is, for example, $Y_2O_2S:Eu^{3+}, Mg^{2+}, Ti^{4+}$. The phosphor emits red secondary radiation.

In another embodiment, the LUCOLED with phosphorescent phosphor is operated by means of dimming with a suitable duty factor, with an off time lasting at least 50 ms. In this case, it is generally possible on the one hand to realize a particularly energy-saving LED, by selecting a duty factor of at least 1:1000 or even down to 1:10 000 or below.

Conventional lucoleds, on account of the flickering effect on the human eye, are forced to use a duty cycle of at most 1:100. The use of suitable storage phosphors, however, offers an elegant way of lowering this threshold further.

On the other hand, in another embodiment, a long-life LED can be realized by selecting the on time and off time to last considerably longer in absolute terms. Standard known values are 5 ms for both phases (on phase and off phase), corresponding to a duty cycle of 50%. The use of storage phosphors offers an elegant way of using significantly longer period durations of the phases, typically at least 50 ms for both phases, with the same duty cycle. In this context, it is less the length of the on phase than the number of switching operations per unit time which is the important factor. Overall, the long off phase which is now possible allows a very considerable reduction in the number of switching operations to be achieved. As a result, the switching losses in the switch are reduced considerably. This reduced loading lengthens the service life.

BRIEF DESCRIPTION OF THE DRAWINGS

The invention is described in more detail below on the basis of a number of exemplary embodiments and the associated figures. The figure is diagrammatic and not to scale.

DETAILED DESCRIPTION OF THE DRAWINGS

Figure 1:
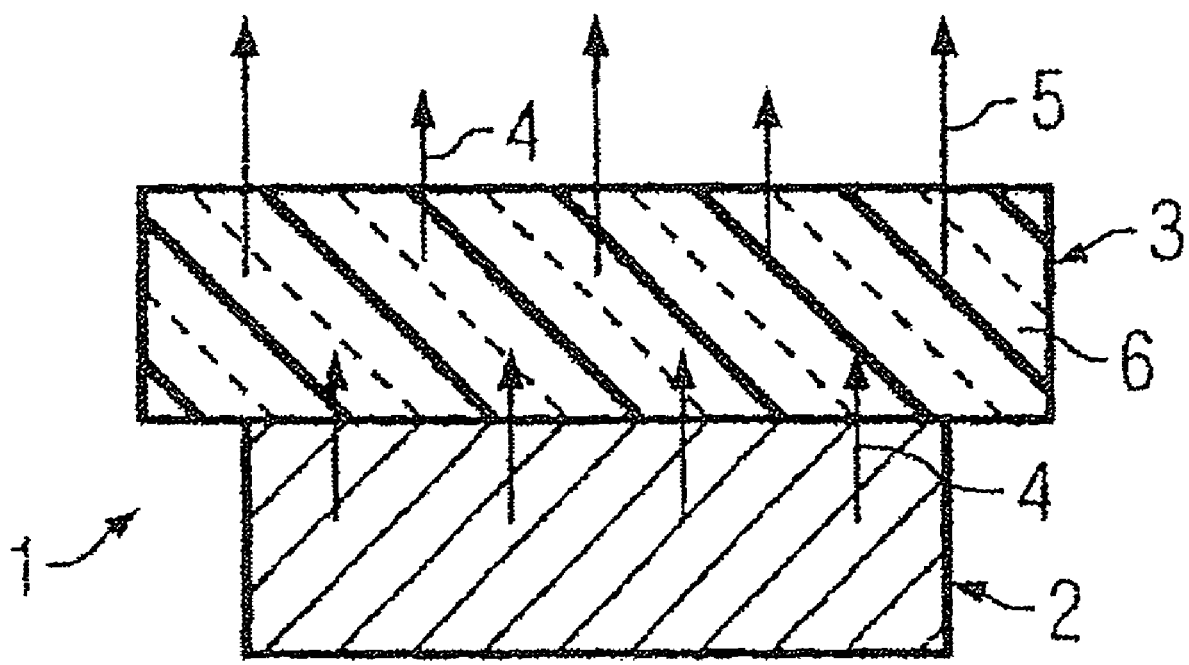
FIG. 1 shows a cross section through a light source in the form of a luminescence conversion LED.

The light source 1 shown in FIG. 1 comprises an LED 2 and a luminescence conversion body 3. The luminescence conversion body 3 consists of an epoxy resin which contains powder particles of the phosphor 6. The epoxy resin forms a matrix for the powder particles. A mean grain size of the powder particles is from 10 μm to 20 μm.

As active layer, the LED 2 has a semiconductor layer of gallium indium nitride. The LED emits blue light (primary radiation 4) with an intensity maximum at approximately 450 nm as a result of being electrically driven.

The phosphor 6 is a strontium aluminate doped with europium and dysprosium. The formal composition of the phosphor 6 is $SrAl_2O_4:Eu^{2+},Dy^{3+}$. This phosphor 6 has a broad absorption band of 450 nm. The primary radiation 4 of the LED 2 is absorbed by the phosphor 6 and converted into the secondary radiation 5. The emission of the secondary radiation 5 is green. At room temperature, the phosphor 6 is still providing residual light of approximately 10% even 200 min after the LED 2 emitting the primary radiation 4 has been switched off. This means that the secondary radiation 5 has a decay time for the luminescence intensity of the secondary radiation 5 to decrease by 50% of well over 1 s.

In accordance with FIG. 1, some of the primary radiation 4 passes through the luminescence conversion body 3 without being absorbed by the phosphor 6. Some of it is absorbed. This results in a mixture of the blue emission of the primary radiation 4 and the green emission of the secondary radiation 5 for the light from the light source 1 when the LED 2 is operating. After the LED 2 has been switched off, the light source 1 is then only providing the green emission of the secondary radiation 5 from the phosphor 6.

In an alternative configuration, the intensity of the primary radiation 4 and the quantity of phosphor 6 are adapted to one another in such a manner that scarcely any primary radiation 4 passes through the luminescence conversion body 6 even during electrical driving of the LED 2. The light source 1 emits the green emission of the secondary radiation 5 both while the LED 2 is being electrically driven and after the LED 2 has been switched off.

According to a further exemplary embodiment, the luminescence conversion body 3 contains a mixture of the phosphor 6 with the formal compositions $CaAl_2O_4:Eu^{2+},Dy^{3+}$ (blue luminescence), $SrAl_2O_4:Eu^{2+},Dy^{3+}$ (green luminescence) and $Y_2O_2S:Eu^{3+},Mg^{2+},Ti^{4+}$ (red luminescence). The phosphors 6 are distinguished by different decay times of the secondary radiation 5. On account of the different decay times, a light color from the light source 1 which changes over the course of time results after the LED 2 has been switched off.

Figure 2:
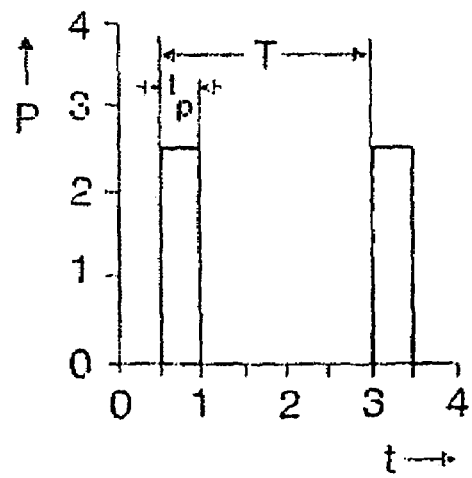
FIG. 2 shows the typical duty cycle of an energy-saving LED.
Figure 3:
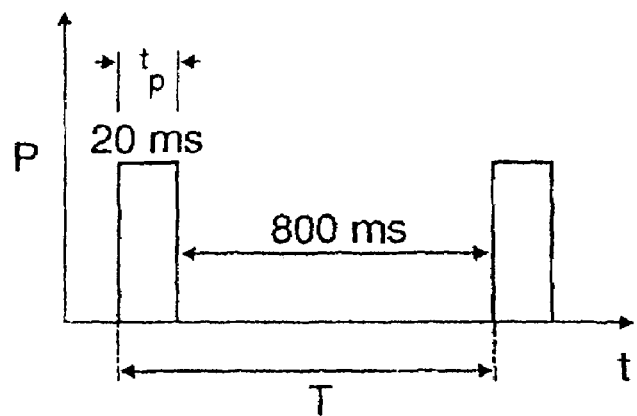
FIG. 3 shows the typical duty cycle of an LED with a long service life.

In an embodiment as an energy-saving LED, the LUCOLED, which is equipped with storage phosphor, is operated by means of PWM, with an off time lasting at least 50 ms, preferably 200 ms. On account of the inertia of the human eye, a duty cycle of 1:1000, and depending on the storage phosphor and its decay time even of 1:10 000 or higher, is quite sufficient to still give the impression of a radiating light source. Specifically, it is possible to use a LUCOLED with a duty factor of 1:5000 using Sr aluminate or yttrium oxysulfide. Overall, the duty factor may in this case be 1:2 to 1:10 000, depending on the choice of phosphor. By way of example, it is possible to use the duty factor as shown in FIGS. 2 and 3.

In a further embodiment, which realizes a long-life and/or inexpensive LED, the LUCOLED equipped with storage phosphor is operated in such a way by means of PWM that a duty factor of 1:1 to 1:10 is used, depending on the storage phosphor and its decay time, in which case the load on the associated switch is reduced, by virtue of the on phase lasting at least 20 ms (preferably >50 ms) and the off phase lasting at least 50 ms, preferably more than 200 ms. This either lengthens the service life of the switch, typically by a factor of two, or alternatively allows a less expensive switch to be used to achieve the same service life as without storage phosphor (replaced by a conventional phosphor with a short decay time) on account of the lower loading. Specifically, it is possible to use a duty cycle of 50% (duty factor 1:2) using zinc sulfide. As is customary in electronics, the duty factor is defined as V=tp/T where tp=pulse duration and T=interpulse period. T is to be understood as meaning the sum of pulse duration and off time.

Conventional techniques which are known from dimming can be used for the driving circuit of a cyclical current control, cf. as well as DE-A 199 30 174 also U.S. Pat. No. 5,907,569 or DE-A 40 05 776.

In principle, all the storage phosphors which have been listed, in particular Sr aluminate or another aluminate or an oxide or sulfide as explained above are suitable for PWM operation. Inherently, the light intensity of many of these phosphors initially decreases significantly, as in the case of normal fluorescent phosphors, but then trapping processes lead to a long-lasting residual phosphorescence being observed, which is still visible to the naked eye for minutes to hours. This residual phosphorescence is still fully visible on account of the sensitivity of the eye. Phosphors in which the decay time for the luminescence intensity to drop to one per mil of the original intensity lasts at least 0.1 s are particularly suitable, and phosphors with a decay time during which the luminescence intensity decreases by 50% of over one second are particularly preferred.

Figure 4:
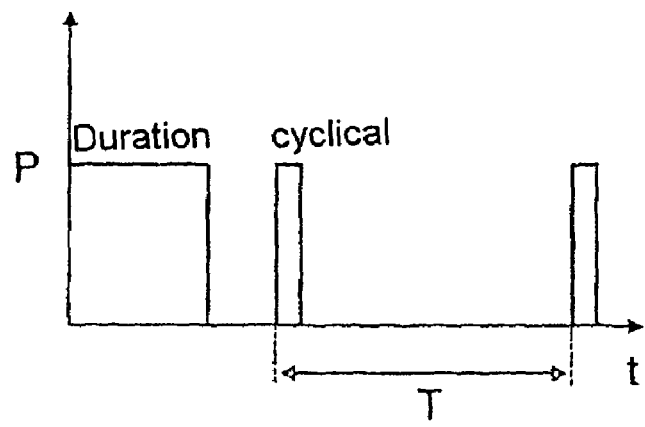
FIG. 4 shows the typical duty cycle of an LED which is operated intermittently.

To ensure that the phosphorescent phosphor continues to emit radiation for a prolonged period of time, it has proven expedient to insert phases of continuous operation between the phase cycles, in order to "recharge" or "regenerate" the phosphorescent phosphor. The duration and frequency of these phases depend on the particular phosphor used. This operating mode is diagrammatically depicted in FIG. 4.

In particular, phosphors which can be excited specifically or particularly well by UV radiation in the range 300 to 400 nm can be used. The advantage of these phosphors is the rapid rechargeability under UV excitation compared to visible radiation.

Examples of suitable storage phosphors include:
SrAl2O4:Eu,Dy
Sr4Al14O25:Eu,RE (RE=rare earth)
Ca2Al2SiO7:Ce
CaYAl3O7:Ce
Ca2Al2SiO7:Mn,Ce
CaAl2O4:Eu,Nd
CaAl2O4:Tb,Ce
CaAl2O4:Mn,Ce
MgSiO3:Mn,Eu,Dy.

The invention claimed is:

1. A light source, comprising:
at least one LED for emitting primary radiation, and
at least one phosphor for converting the primary radiation (4) into secondary radiation,
wherein the secondary radiation has a decay time at room temperature of at least 0.1 s before the luminescence intensity of the secondary radiation is no longer perceptible to the human eye, and the phosphor is selected from the group consisting of oxide, aluminate, and sulfide activated with the aid of a plurality of dopings so that the phosphor is phosphorescent.

2. The light source as claimed in claim 1, in which there are a plurality of phosphors with different decay times.

3. The light source of claim 1, wherein the primary radiation is blue light with a maximum intensity at approximately 450 nm.

4. The light source as claimed in claim 1, wherein the phosphor is aluminate phosphor, the aluminate phosphor includes an alkaline earth metal aluminate, and the plurality of dopings comprise europium and dysprosium.

5. The light source as claimed in claim 1, wherein the phosphor is sulfide phosphor, the sulfide phosphor includes a zinc sulfide, and the plurality of dopings comprise copper and silver.

6. The light source as claimed in claim 1, wherein the phosphor includes an yttrium oxysulfide, and the plurality of dopings comprise europium, and at least one of magnesium and titanium.

7. The light source as claimed in claim 1, wherein the decay time until the luminescence intensity has dropped to one per mil of the original intensity is at least 0.1 s.

8. The method as claimed in claim 7, wherein the duty factor between pulse duration and interpulse period is in the range from 1:2 to 1:10 000.

9. The method as claimed in claim 7, wherein the light source is operated intermittently as a result of phases of continuous operation alternating with phases of cyclical operation.

10. The method as claimed in claim 7, wherein the duty factor between pulse duration and interpulse period is below 1:10 000.

11. The light source of claim 1, wherein the phosphor is sulfide, the sulfide phosphor includes an oxisulfide, and the plurality of dopings comprise europium and at least one of magnesium and titanium.

12. An emergency lighting comprising the light source of claim 1.

13. The light source of claim 1, wherein the phosphor is aluminate phosphor, the aluminate phosphor includes an alkaline earth metal aluminate, and the plurality of dopings comprise europium and rhenium.

14. The light source as claimed in claim 1, wherein a decay time during which the luminescence intensity decreases by 50% is over one second.

15. A method for operating the light source as claimed in claim 1, wherein the light source is operated cyclically with a predetermined duty factor, with the off time lasting at least 50 ms.

16. The method as claimed in claim 15, wherein the off time lasts at least 200 ms.

* * * * *